United States Patent
Hsieh et al.

(10) Patent No.: US 7,142,769 B2
(45) Date of Patent: Nov. 28, 2006

(54) ILLUMINATION PACKAGE

(75) Inventors: Min-Hsun Hsieh, Hsinchu (TW);
Chou-Chih Yin, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 11/233,030

(22) Filed: Sep. 23, 2005

(65) Prior Publication Data
US 2006/0067640 A1    Mar. 30, 2006

(30) Foreign Application Priority Data
Sep. 24, 2004   (TW)  .............. 93129157 A
May 6, 2005     (TW)  .............. 94114630 A

(51) Int. Cl.
  *G02B 6/10*    (2006.01)
  *F21S 8/10*    (2006.01)
  *G01L 27/15*   (2006.01)
(52) U.S. Cl. .............. 385/146; 362/317; 362/327; 257/79
(58) Field of Classification Search .............. 385/146
See application file for complete search history.

(56) References Cited
U.S. PATENT DOCUMENTS 5,404,869 A * 4/1995 Parkyn et al. .............. 126/699
6,582,103 B1 * 6/2003 Popovich et al. ........... 362/307
6,598,998 B1   7/2003 West et al.
6,607,286 B1   8/2003 West et al.
6,679,621 B1 * 1/2004 West et al. .................. 362/327
6,974,229 B1 * 12/2005 West et al. .................. 362/227
7,034,343 B1 * 4/2006 Kim et al. ..................... 257/98
2004/0070855 A1 * 4/2004 Benitez et al. .............. 359/858
2004/0207999 A1 * 10/2004 Suehiro et al. ............... 362/84
2004/0218390 A1 * 11/2004 Holman et al. .............. 362/245
2005/0024744 A1 * 2/2005 Falicoff et al. .............. 359/737

* cited by examiner

*Primary Examiner*—Michelle Connelly-Cushwa
*Assistant Examiner*—Chris Chu
(74) *Attorney, Agent, or Firm*—Rabin & Berdo, PC

(57) ABSTRACT

An illumination package is disclosed in the invention. The illumination package includes an optical element, package base, and a light emitter. The optical element is designed to redirect a majority of light emitted from the light emitter to a direction approximately perpendicular to a longitudinal axis of the optical element. In one embodiment, the optical element includes an flared portion and a base portion. The flared portion is constructed by an upper surface forming a recess, a side surface adjacent to the upper surface and curved, and a lower surface connecting to the base portion. In another embodiment, a concave lens is formed on the upper surface.

17 Claims, 12 Drawing Sheets

ILLUMINATION PACKAGE

RELATED APPLICATIONS

The present application claims the right of priority based on Taiwan Application Serial Number 093129157, filed Sep. 24, 2004; and Taiwan Application Serial Number 094114630, filed May 6, 2005, the disclosures of which are incorporated herein by reference in their entirety.

FIELD OF THE INVENTION

The present invention relates to an illumination package, and more particularly to a light emitter coupled with an optical lens able to redirect light to a direction approximately perpendicular to the longitudinal axis passing through a horizontal surface of the illumination package.

BACKGROUND OF THE INVENTION

FIG. 1 illustrates a conventional Light Emitting Diode (LED) package 10 that includes an optical lens 11, a package base 12, and a LED chip 13. The LED package 10 has a longitudinal axis 15 passing through the center of the optical lens 11. The LED chip 13 is positioned on the package base 12. The package base 12 may have a cup (not shown) with a reflector (not shown) to reflect light emitted from the bottom and sides of the LED chip 13 towards the observer.

The optical lens 11 is coupled to the LED chip 13 to receive and redirect light emitted from the LED chip 13. The optical lens 11 may have a recess 14 to accommodate the LED chip 13. The light entering through the recess 14 of the optical lens 11 may travel in two main light paths. The first light path LP1 is that the light emitted from the LED chip 13 travels to the surface 1102 and be total-internal-reflected to exit through sidewall 1101 at approximately 90 degree to the longitudinal axis 15. The second light path LP2 is that the light emitted from the LED chip 13 travels towards the sidewall 1101 at an angel causing total internal reflection or a reflection from the sidewall 1101 to exit the optical lens 11 at an angle not close to perpendicular to the longitudinal axis 15. The first light path LP1 is preferable to generate an efficient side emitting light, while the second light path LP2 may cause a light spot, which is not desirable with the observer.

A need exists for an LED package or illumination device to reduce its entire size by coupling a shallow optical lens and avoid light spots suffered by the observer. A need also exists for an LED package or illumination device to provide uniform colored light.

SUMMARY OF THE INVENTION

In accordance with one embodiment of the invention, a illumination package includes a optical element, a package base, and a light emitter. The light emitter is disposed on a surface of the package base. The optical element is attached to the package base and/or light emitter. The optical element has a flared portion and a base portion. The flared portion is formed by a upper surface, a side surface, and a lower surface. The upper surface forms a recess of the flared portion. The side surface is adjacent to upper surface and obliquely angled with respect to a longitudinal axis approximately normal to a horizontal surface of the base portion. Besides, the side surface is curved, and preferably is formed as a concaved surface. The lower surface is adjacent to the side surface and connecting to the base portion. The optical element may be radially symmetric about the longitudinal axis.

In accordance with another embodiment of the invention, the optical element is formed in a longitudinal direction, preferably, is bilaterally symmetric about a longitudinal plane passing through the optical element. Furthermore, a convex lens is formed on the upper surface. Specifically, the upper surface is formed as a ripply surface. The propagation direction of the ripples formed on the upper surface may be parallel to the longitudinal direction. The radius of the convex lens is about between 50 ~60 μm. The light emitter is preferably arranged along the propagation direction.

DETAILED DESCRIPTION OF THE PREFERRED EMBODIMENT

Figure 1:
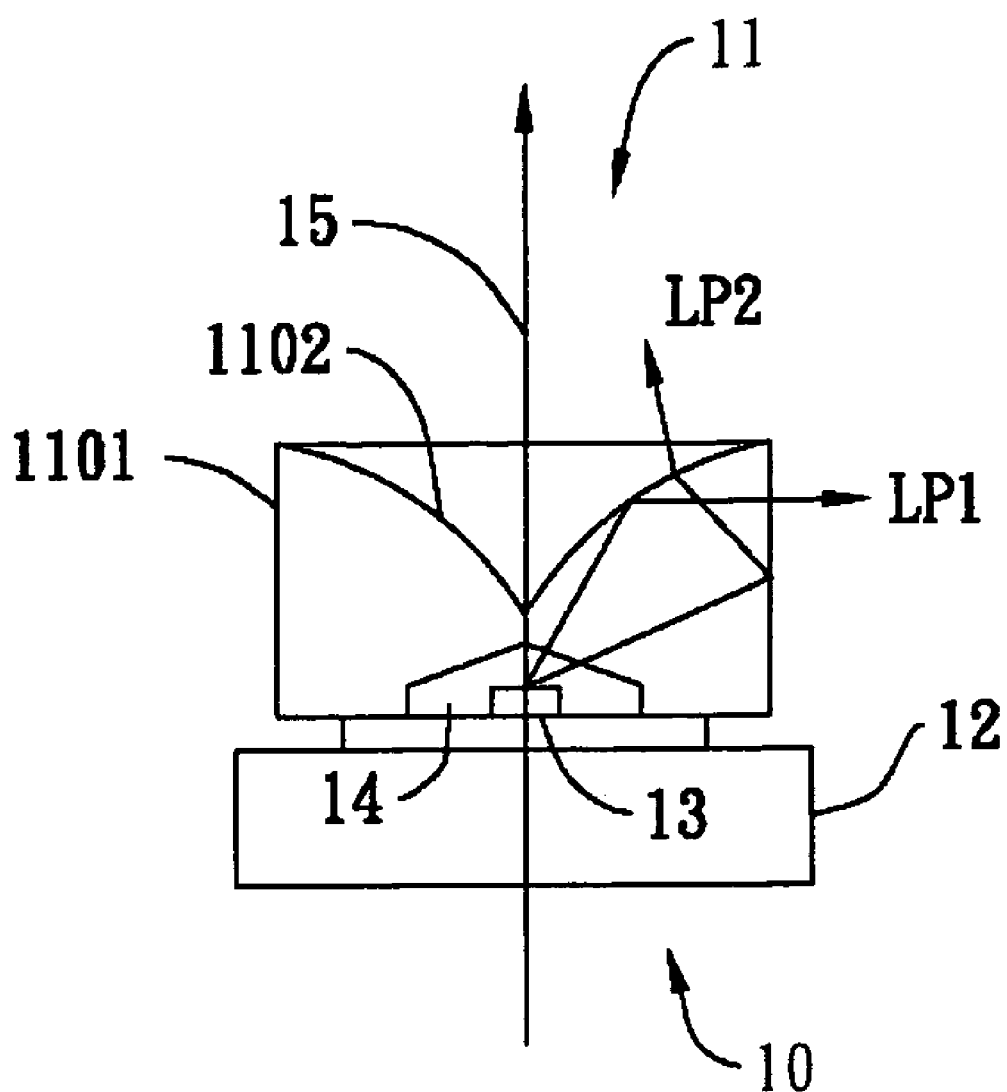
FIG. 1 illustrates a conventional LED package.
Figure 2A:
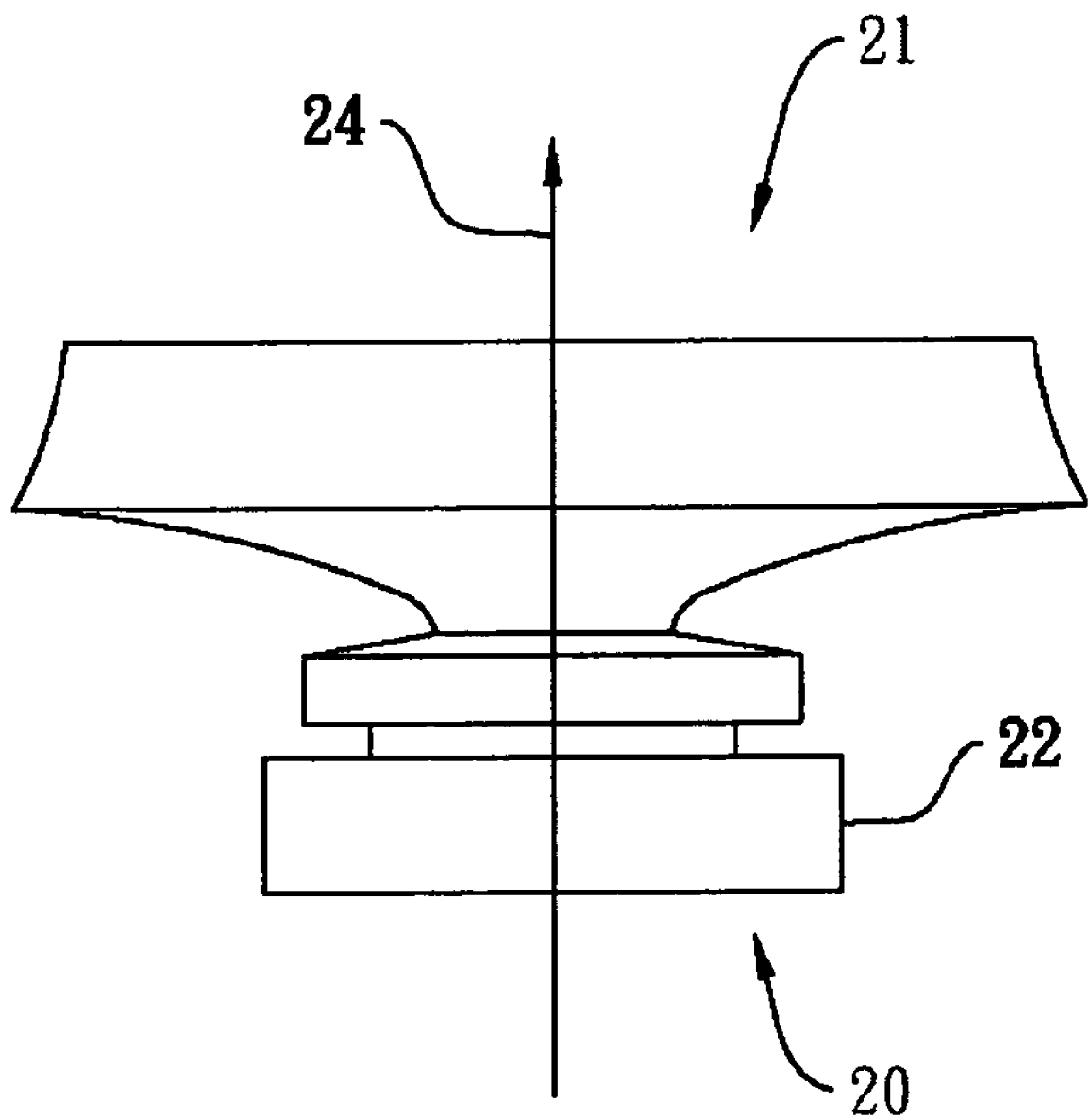
FIG. 2A illustrates one embodiment of the invention.

FIG. 2A illustrates an example of an illumination package 20 in accordance with one embodiment of the invention. The illumination package 20 includes an optical element 21, a package base 22 and a longitudinal axis 24. The optical element 21, such as a lens, is coupled to the package base 22 for redirecting light entering thereinto. The longitudinal axis 24 may pass through the center of the optical element 21 or not, and, preferably, be approximately perpendicular to a horizontal surface of the package base 22.

Figure 2B:
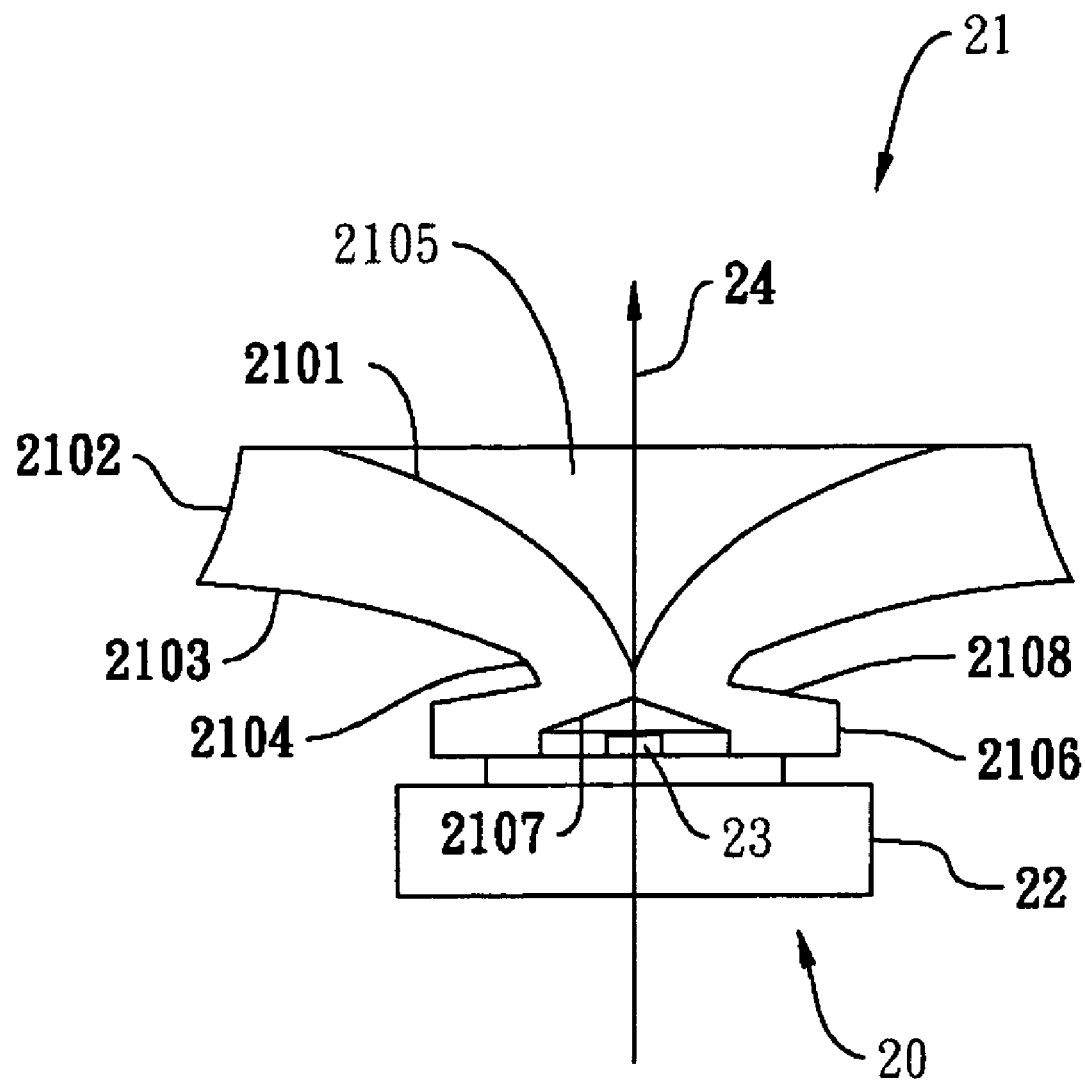
FIG. 2B illustrates a cross sectional view of an illumination package of FIG. 2A.

FIG. 2B illustrates a cross sectional view of the illumination package 20 of FIG. 2A. Light emitter 23 is disposed on a surface of the package base 22. The light emitter 23 includes but not limited to an LED chip, laser diode, an incandescent lamp, a fluorescent tube, a Cold Cathode Fluorescent Lamp, and any other device able to emit light and be coupled to the optical element 21.

The optical element 21 may be a separate component and attached to the package base 22 by various means including but not limited to screw fixing, snap fitting, friction fitting, adhesive bonding, heat stacking, and ultra-sonic welding. Alternatively, the optical element 21 may be formed onto the package base 22 and/or the light emitter 23 by various means including but not limited to injection molding and casting.

The optical element 21 is made of a light-pervious material. The light-pervious material may be a transparent material or an opaque material being totally or partially pervious to light emitted from the light emitter 23. The light-pervious material includes but not limited to acrylic resin, COC, PMMA, PC, PC/PMMA, Polyetherimide (PEI), fluorocarbon polymer, and silicone. The light-pervious material may be colored to make the optical element 21 acts as a filter in order to generate desired colored light.

If the illumination package 20 is positioned in an environment filled with air having a refractive index of one, the refractive index of the optical element 21 has to range between 1.4 to 1.8 in order to create the desired field of illumination in the invention. The refractive index of the optical element 21 may be a number other than the above range based on the environment where the illumination package 20 resides or be used. Preferably, the difference of the refractive index between the optical element 21 and the environment where it exists is between 0.45 to 0.5.

As shown in FIG. 2B, the optical element 21 includes a flared portion and a base portion 2106. The flared portion has an upper surface 2101 forming a recess 2105 in the light-pervious material, a side surface 2102 adjacent to the upper surface 2101, and a lower surface 2103 adjacent to the side surface 2102. The base portion 2106 is designed to receive light from the light emitter 23 and may have a cavity 2107 for accommodating the light emitter 23. The optical element 21 is designed to redirect the majority of light from the light emitter 23 to exit the optical element 21 at the direction approximately normal to the longitudinal axis 24 or the direction not directly pointing to the observer. Furthermore, to avoid a dark spot appearing above the optical element 21, the minority of light from the light emitter 23 may be directed to the direction approximately parallel to the longitudinal axis 24 or the direction pointing to the observer.

The recess 2105 is designed to form the upper surface 2101. Preferably, the recess 2105 may have an apex, where the upper surface 2101 sinks, pointing to the light emitter 23. The apex may be passed by the longitudinal axis 24 or not. A reflective material or structure may be formed on the recess 2105 to totally or partially reflect light traveling to the upper surface 2101. The reflective material or structure includes but not limited to Ag, Al, Cu, Au, Cr, reflective paint, and Distributed Bragg Reflector (DBR). An ultraviolet resistant material may also be formed on the recess 2105 to prevent the package's components, especially those sensitive to ultraviolet, from degradation in the presence of ultraviolet.

The upper surface 2101 is designed as a total internal reflection (TIR) surface to reflect light entering from the base portion 2106 and prevent it from exiting through the recess 2105, but some light may still pass through the upper surface 2105 at a certain incident angle varying with the overall design of the illumination package 20. The upper surface 2101 may be a flat surface or a curved surface having a constant radius or more than one radius. Specifically, the curved surface may have a variable radius changing along the curved path of the upper surface 2101. Preferably, the radius distant from the apex is larger than that near the apex.

The side surface 2102 is designed to be adjacent to the upper surface 2101 and obliquely angled with respect to the longitudinal axis 24 for directing light to the side of the optical element 21, specifically, to the direction approximately normal to the longitudinal axis 24. If the angle between the normal vector of the side surface 2102 and the longitudinal axis 24 is about 90 degree, a high percentage of light exiting through the side surface 2102 will travel downward. On the other hand, if the side surface 2102 is obliquely angled with respect to the longitudinal axis 24 and preferably faces upward, as shown in FIG. 2B, less light will travel downward. The side surface 2102 can be formed in a plane, a rough or curved surface. The curved surface can be a concave, a convex, or both. A concave side surface will diverge the light passing through it, while a convex side surface will converge the light passing through it. A rough side surface may scatter light.

The lower surface 2103 is designed to be adjacent to the side surface 2102 and connect to the base portion 2106. The upper surface 2101, the side surface 2102, and the lower surface 2103 form a flared portion above the base portion 2106.

A concaved surface 2104 can be formed between the lower surface 2103 and the base portion 2106. Light emitted from the light emitter 23 and falling on the concaved surface 2104 may be reflected to the area of the recess 2105 and thus increase the amount of light exiting through the recess 2105. In that case, the observer may not easily detect a dark spot appearing above the recess 2105 of the optical element 21 of the illumination package 20.

A cavity 2107 can be formed in the base portion 2106 to accommodate the light emitter 23. The cavity 2107 has a volume preferably forming as a cone or a pyramid. The apex of cone or pyramid may point to the apex of the recess 2105. The terrace 2108 of the base portion 2106 may be formed as a horizontal plane, a curved surface or an incline. Light passing through the incline sloping at a certain angle may be refracted and move substantially perpendicular to the longitudinal axis 24.

Figure 2C:
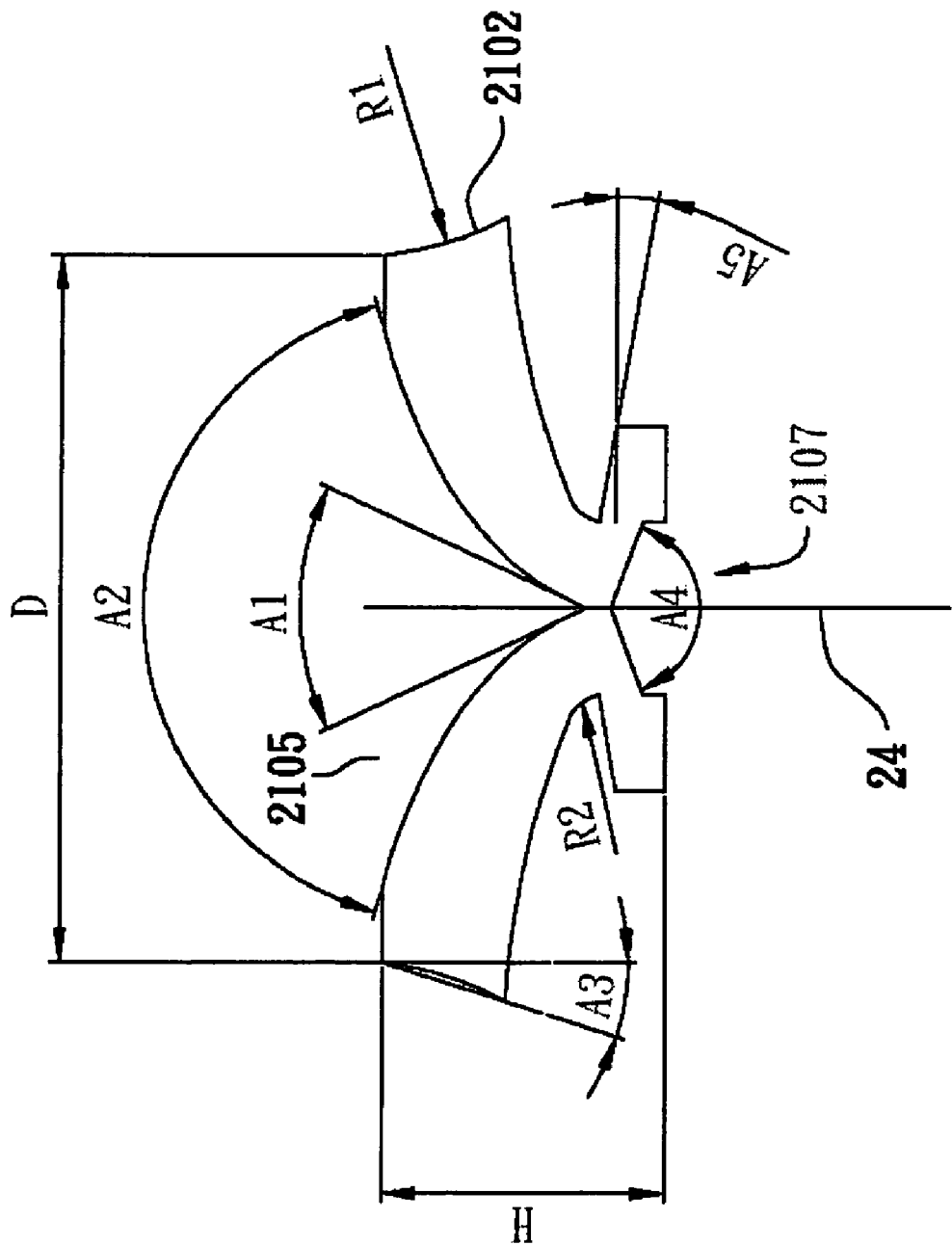
FIG. 2C illustrates a cross sectional view of an optical element coupling to the illumination package of FIG. 2A.

FIG. 2C illustrates a cross sectional view of the optical element 21 in accordance with a better embodiment of the invention. Some sketch lines and notations in FIG. 2C are omitted for clarity. As shown in FIG. 20, the optical element 21 is presumed to be radially symmetric about the longitudinal axis 24 and has a diameter D of 105 mm and height H of 14 mm. The angle of the apex of the recess 2105 may be varied between A1 degree and A2 degree, wherein A1 is 30 degrees and A2 is 180 degrees, preferably, between A1 degree and A2 degree, wherein A1 is 50 degrees and A2 is 145 degrees. The angle A3 between the side surface 2102 and the longitudinal axis 24 may be varied between 5 degree and 20 degree. The angle A4 of the apex of the cavity 2107 may be varied within 180 degree, preferably between 90 degree and 140 degree. The angle A5 of the slope of terrace 2108 may be varied within 60 degree, preferably within 10 degree. The radius R1 of the side surface 2102 may be varied within 20 mm, preferably within 10 mm. The radius R2 of concaved surface 2104 may be varied within 10 mm. The above dimensions may be adjusted based on the scale and specific design of the optical element 21.

Figure 2D:
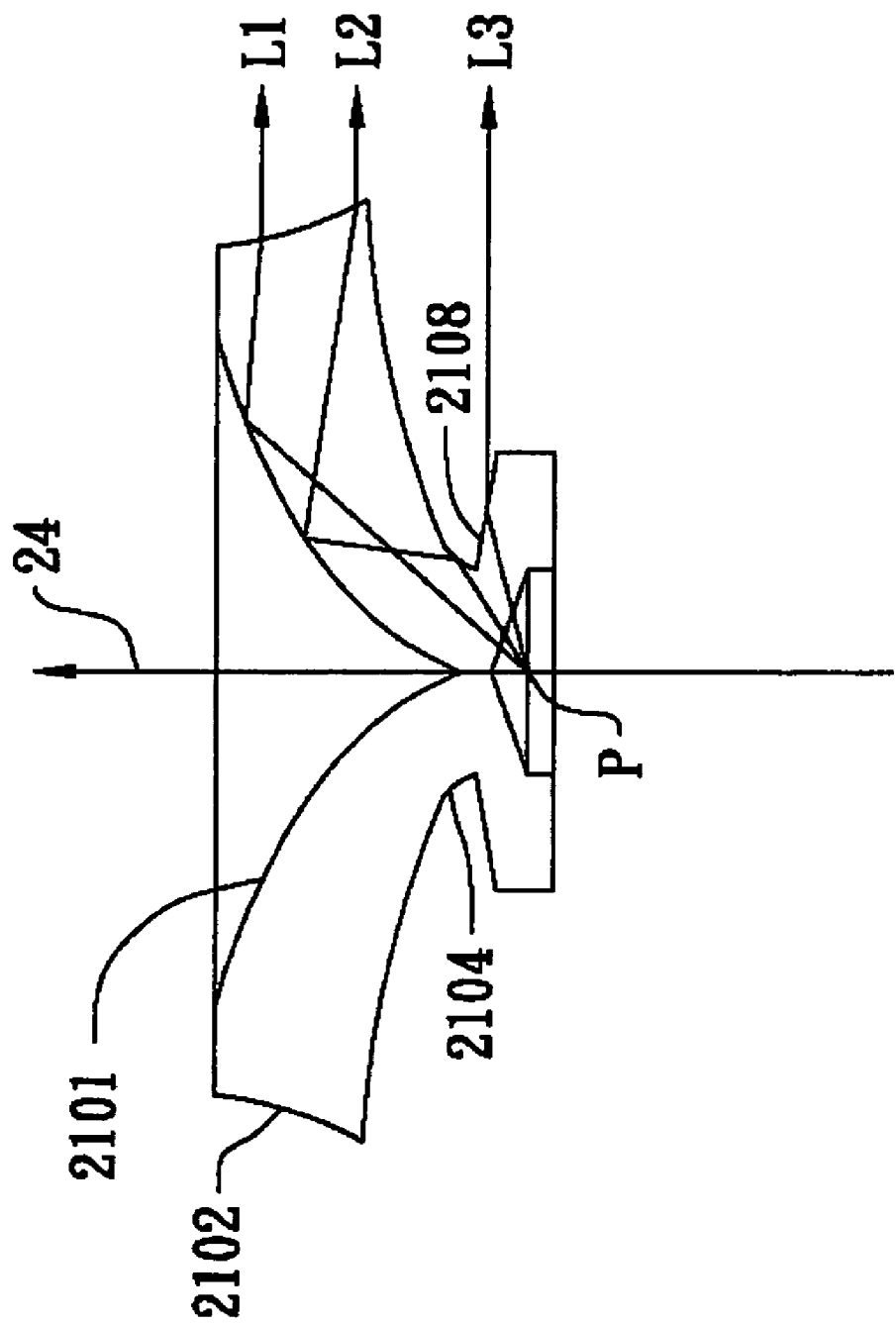
FIG. 2D illustrates ray-traces of one embodiment of the optical element.

FIG. 2D illustrates ray traces of light through the optical element 21 from an emitting point P inside the base portion. The light trace L1 emitted from the point P and incident on the upper surface 2101 is bent for total internal reflection and horizontally exits the optical element 21 for the refraction caused by the curved side surface 2102. The light trace L2 emitted from the point P and bent on the concaved surface 2104 to the upper surface 2101 is redirected twice for total internal reflection and horizontally exits the optical element 21 for the refraction caused by the curved side surface 2102. The light trace L3 emitted from the point P and incident on the inclined surface of the terrace 2108 is refracted off and horizontally exits out the optical element 21.

The shape of optical element 21 from a top view may be an ellipse, a circle, or a rectangle. If the optical element 21 is radially symmetric about the longitudinal axis 24 passing through the center of the optical element 21, the shape of optical element 21 from top view is a circle. In the case, the longitudinal axis 24 may also pass through the apex of the recess 2105. If the optical element 21 is bilateral symmetric about a central plane dividing the optical element 21 into two identical parts, the shape of optical element 21 from top view can be an ellipse, a circle, or a rectangle. In the case, the longitudinal axis 24 resides on the central plane and may pass through the apex of the recess 2105.

Figure 3A:
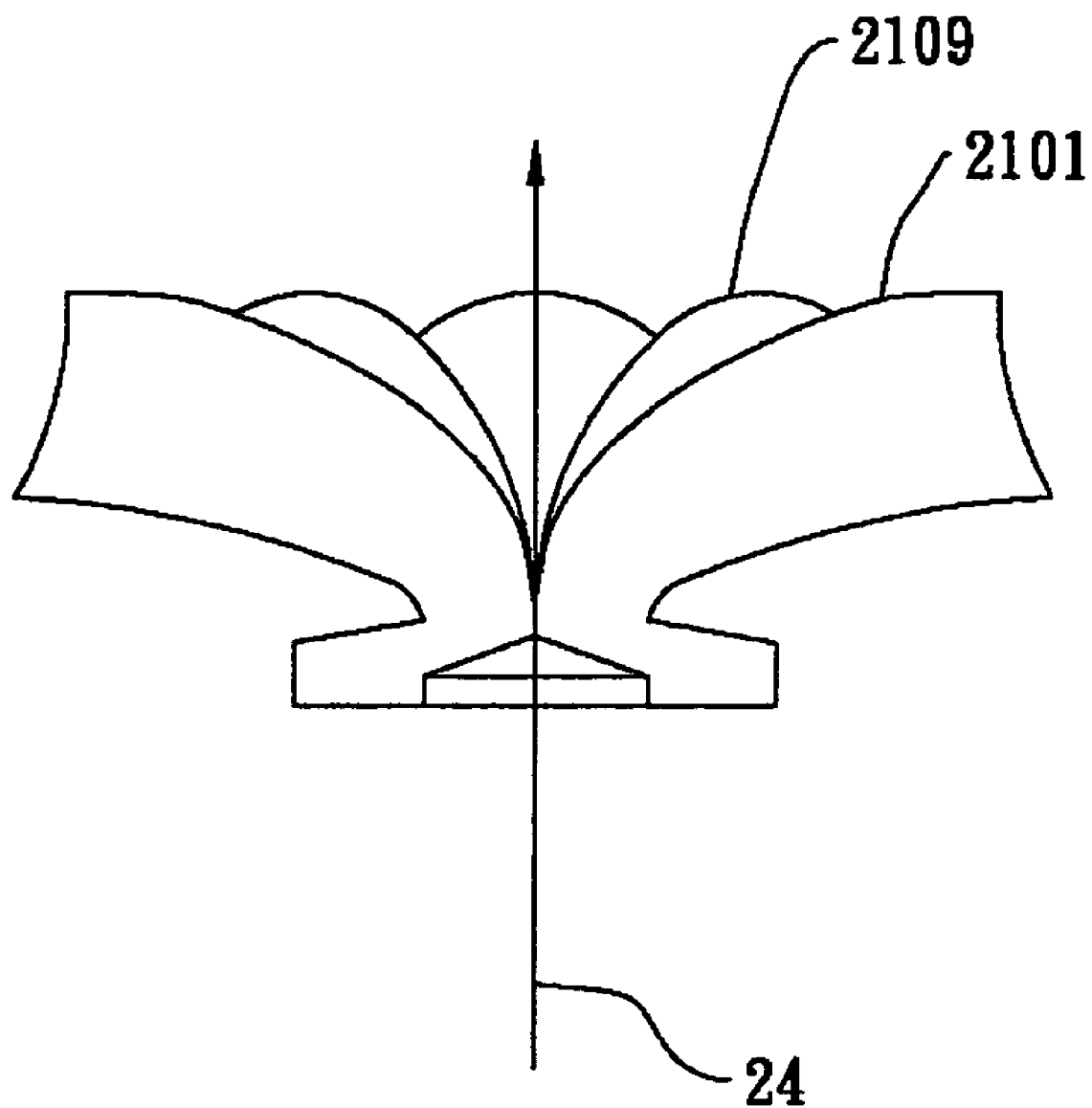
FIG. 3A illustrates a cross sectional view of an illumination package in accordance with another embodiment of the invention.
Figure 3B:
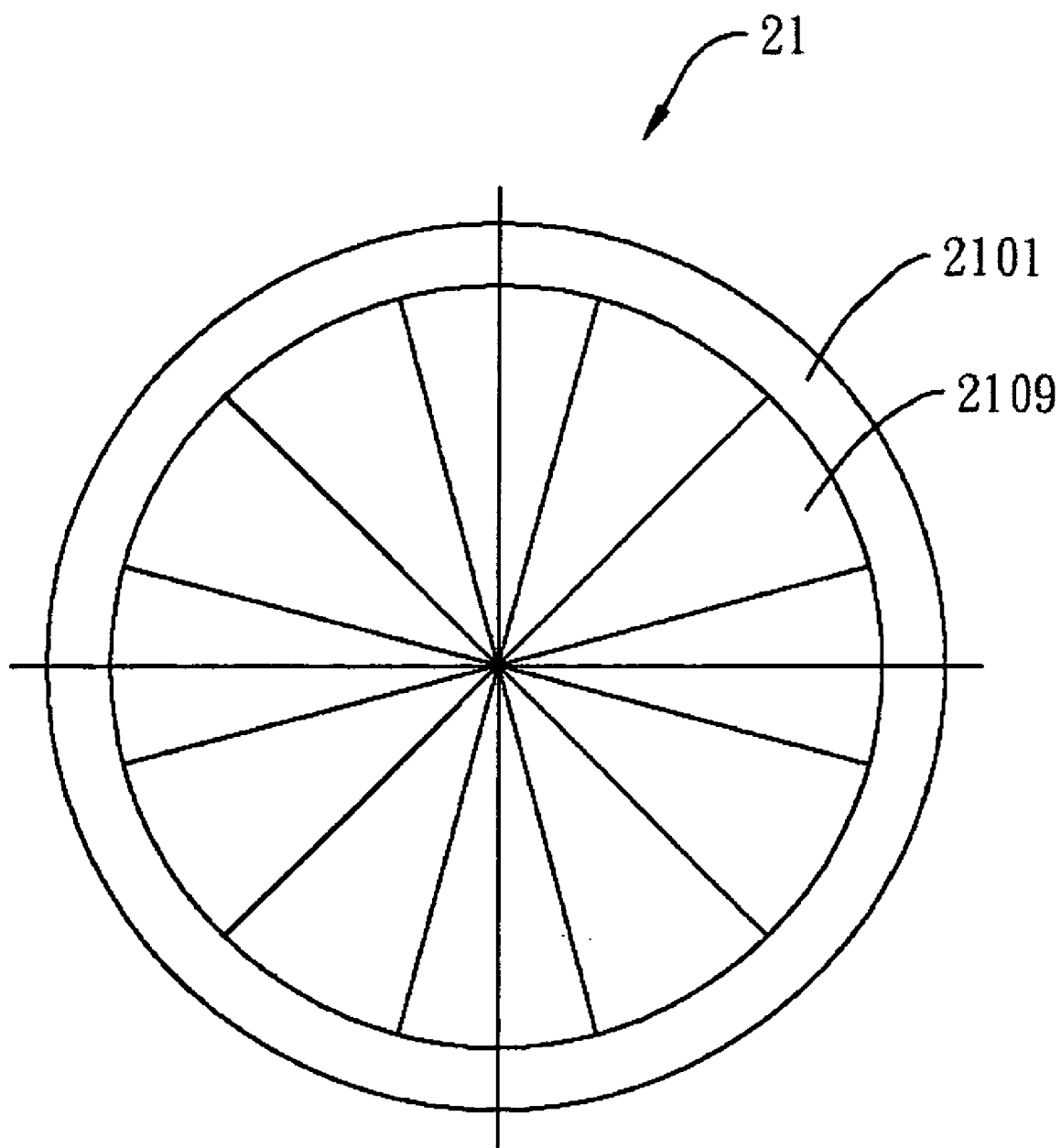
FIG. 3B illustrates a top view of the illumination package of FIG. 3A.
Figure 3C:
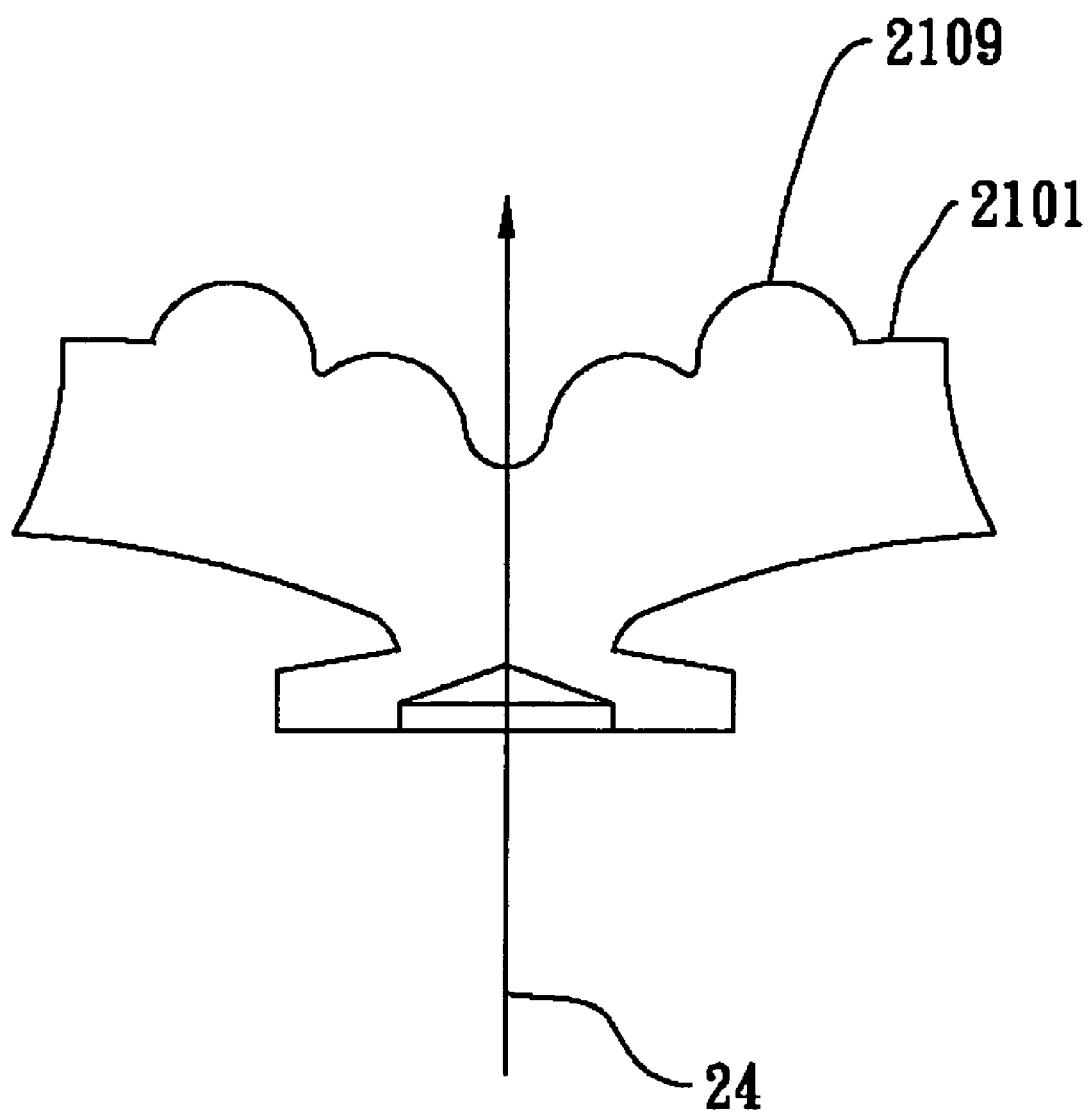
FIG. 3C illustrates a cross sectional view of an illumination package in accordance with another embodiment of the invention.
Figure 3D:
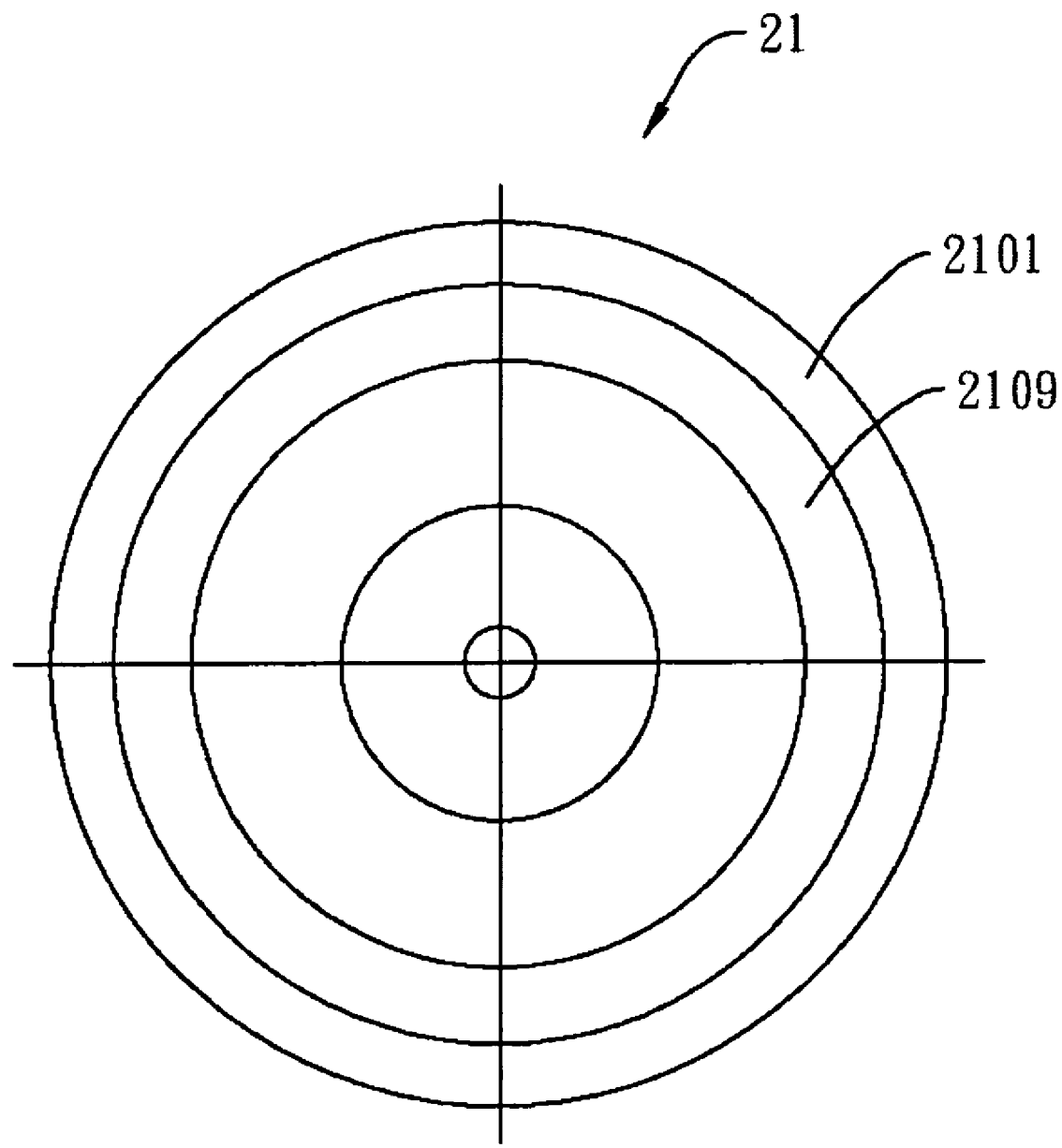
FIG. 3D illustrates a top view of the illumination package of FIG. 3C.

FIGS. 3A–3D illustrate the optical elements 21 in accordance with another embodiment of the invention. In this embodiment, the upper surface 2101 of the optical element 21 is formed as a ripply surface. The ripple 2109 of the upper surface 2101 may sweep about the longitudinal axis 24, as shown in FIG. 3A, or move radially outward from the deepest portion of the recess 2105, as shown in FIG. 3C. FIGS. 3B and 3D are the top views of the two types of the ripply surfaces respectively. The ripples 2109 can be formed as a plurality of convex lenses. The radius of the convex lens may be varied about between 50 ~60μm.

Figure 4:
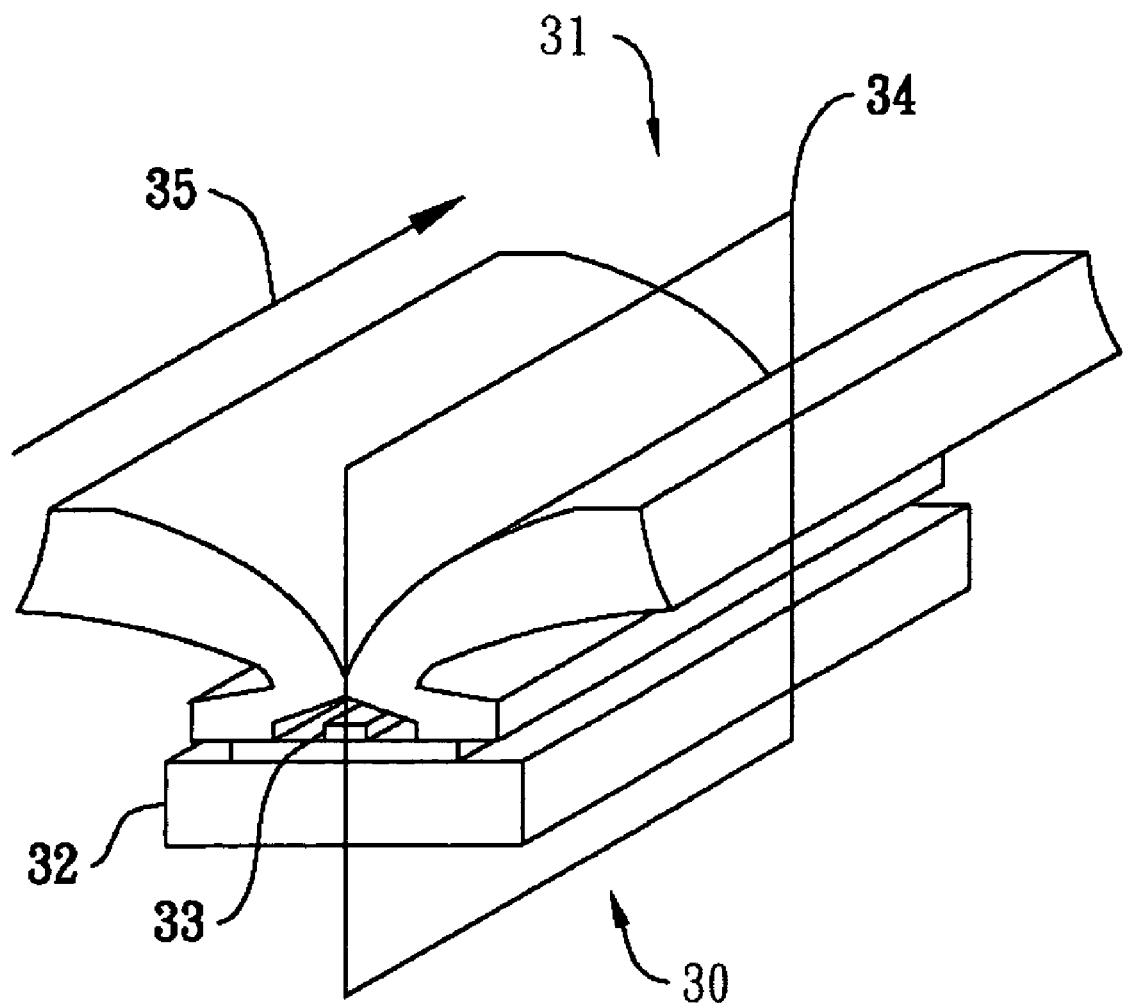
FIG. 4 illustrates a perspective view of further embodiment of the invention.

FIG. 4 illustrates a perspective view of a further embodiment of the invention. The illumination package 30 of this embodiment includes an optical element 31, a package base 32, light emitter 33, and a longitudinal plane 34. The optical element 31 has a cross section similar to that of the optical element 21 illustrated above. The difference between the optical elements 31 and 21 is that the optical element 31 is formed in a longitudinal direction 35 and passed by a longitudinal plane 34. The longitudinal direction 35 is normal to the cross section of the optical element 31. The longitudinal plane 34 may pass through the centerline of the optical element 31 or not, and, preferably, be approximately perpendicular to a horizontal surface of the package base 32.

Figure 5A:
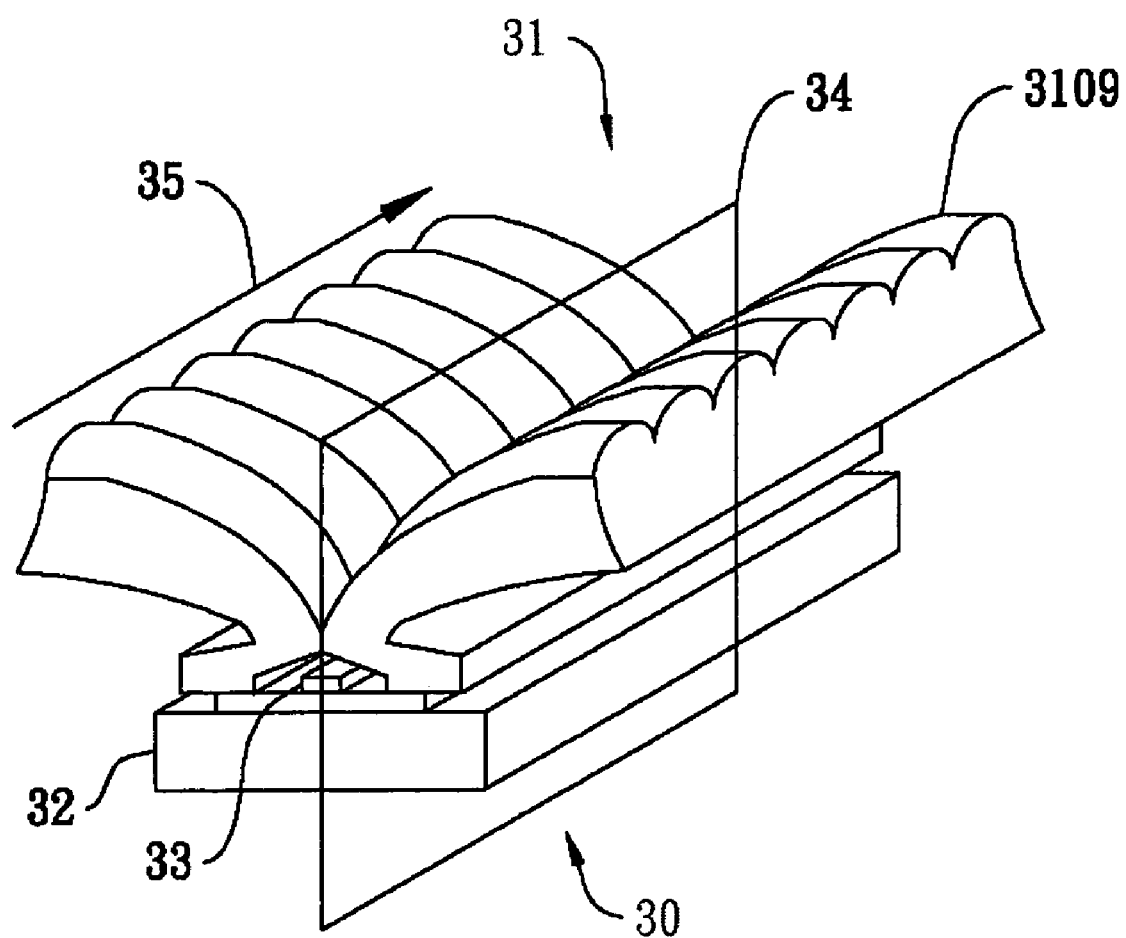
FIG. 5A illustrates a perspective view of another further embodiment of the invention.
Figure 5B:
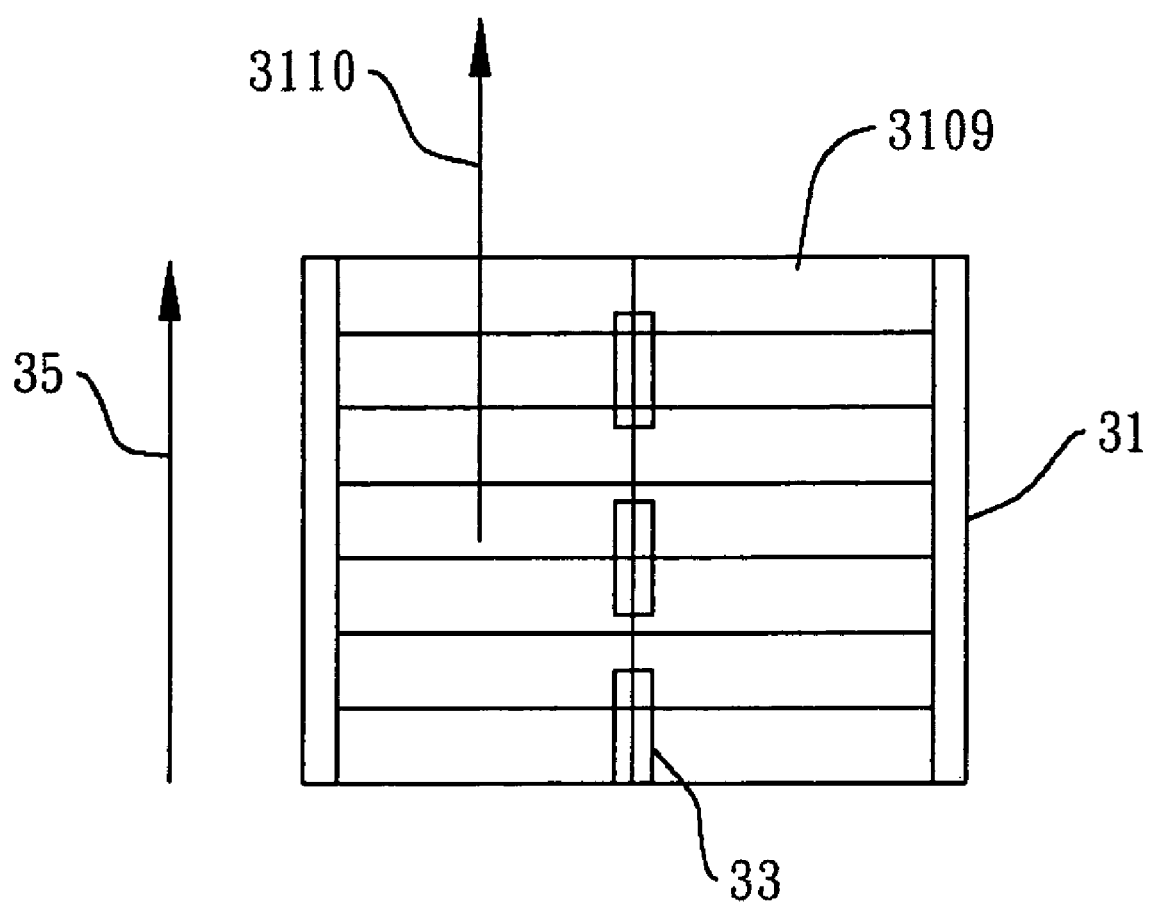
FIG. 5B illustrates a top view of an illumination package of FIG. 5A.

FIG. 5A illustrates a perspective view of an illumination package with a ripply upper surface in accordance with an embodiment of the invention. FIG. 5B illustrates the top view of the illumination package of FIG. 5A. As shown in FIG. 5A, the illumination package 31 has components similar to those in FIG. 4 except the ripples 3109 formed on the upper surface of the optical element 31. As shown in FIG. 5B, the ripples 3109 run along a propagation direction 3110. The propagation direction 3110 is the direction where the ripples move, and preferably parallels or approximately parallels to the longitudinal direction 35, but other direction is also accepted. The light emitter 33 ray be disposed below the optical element 31, and preferably arranged in a direction parallel to the propagation direction 3110.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. An optical element comprised of a light-pervious material, comprising:
    an upper surface formed by a refractive index interface to reflect light from a light emitter and forming a recess on said light-pervious material;
    a bottom surface opposite to said recess and through which light enters into said light-pervious material; and
    a side surface curved to be adjacent to an edge of said upper surface for directing a portion of the light to a side of said optical element, said side surface facing upward;
    wherein said side surface is formed as a concaved surface.

2. The optical element of claim 1, wherein said upper surface is formed as a curved surface.

3. The optical element of claim 1, wherein said upper surface is formed with a radius increasing outward from a deepest portion of said recess.

4. The optical element of claim 1, wherein said recess is formed as a vortex shape having an apex.

5. The optical element of claim 1, wherein said side surface is obliquely angled with respect to a longitudinal axis substantially perpendicular to said bottom surface.

6. The optical element of claim 1, wherein said upper surface and said side surface are radially symmetric about a longitudinal axis passing through the optical element.

7. The optical element of claim 1, wherein said upper surface and said side surface are bilaterally symmetric about a longitudinal plane passing through the optical element.

8. The optical element of claim 1, wherein said refractive index interface is formed between materials having different refractive indexes.

9. The optical element of claim 8, wherein a difference between the refractive indexes of the materials ranges between 0.45 and 0.5.

10. The optical element of claim 1, wherein said upper surface is formed as a ripply surface.

11. The optical element of claim 1, wherein a convex lens is formed on said upper surface.

12. The optical element of claim 11, wherein a radius of said convex lens is formed between 50 μm~60 μm.

13. The optical element of claim 1, wherein said light emitter is selected from the group consisting of a light emitting diode, laser diode, an incandescent lamp, a fluorescent tube, and a Cold Cathode Fluorescent Lamp.

14. The optical element of claim 1, wherein said light-pervious material is selected from the group consisting of acrylic resin, COC, PMMA, PC, PC/PMMA, Polyetherimide (PEI), fluorocarbon polymer, and silicone.

15. An optical element comprised of a light-pervious material, comprising:
    an upper surface formed by a refractive index interface to reflect light from a light emitter and forming a recess on said light-pervious material;
    a bottom surface opposite to said recess and through which light enters into said light-pervious material;
    a side surface curved to be adjacent to an edge of said upper surface for directing a portion of the light to a side of said optical element, said side surface facing upward; and
    a cavity for accommodating said light emitter;
    wherein said cavity is formed as a cone shape or a pyramid shape.

16. An optical element comprised of a light-pervious material comprising:
    an upper surface formed by a refractive index interface to reflect light from a light emitter and forming a recess on said light-pervious material;
    a bottom surface opposite to said recess and through which light enters into said light-pervious material;
    a side surface curved to be adjacent to an edge of said upper surface for directing a portion of the light to a side of said optical element, said side surface facing upward;
    a lower surface adjacent to said side surface; and
    a base portion disposed below said upper surface, said side surface, and said lower surface;
    wherein said base portion has an inclined terrace.

17. The optical element of claim 16, further comprising:
    a concaved surface formed between said lower surface and said base portion.

* * * * *